United States Patent
Li

(10) Patent No.: US 11,379,019 B2
(45) Date of Patent: Jul. 5, 2022

(54) RADIATOR

(71) Applicant: SHENZHEN WAN JING HUA TECHNOLOGY CO., LTD., Shenzhen (CN)

(72) Inventor: Jun-Yu Li, Shenzhen (CN)

(73) Assignee: SHENZHEN WAN JING HUA TECHNOLOGY CO., LTD., Shenzhen (CN)

( * ) Notice: Subject to any disclaimer, the term of this patent is extended or adjusted under 35 U.S.C. 154(b) by 12 days.

(21) Appl. No.: 17/030,564

(22) Filed: Sep. 24, 2020

(65) Prior Publication Data

US 2021/0357009 A1 Nov. 18, 2021

(30) Foreign Application Priority Data

May 15, 2020 (CN) .......................... 202010411971.0

(51) Int. Cl.
*G06F 1/20* (2006.01)
*H05K 7/20* (2006.01)

(52) U.S. Cl.
CPC ........... *G06F 1/20* (2013.01); *H05K 7/20909* (2013.01); *G06F 2200/201* (2013.01)

(58) Field of Classification Search
CPC .. G06F 1/20; G06F 2200/201; H05K 7/20909
See application file for complete search history.

(56) References Cited

U.S. PATENT DOCUMENTS 10,058,009 B2 * 8/2018 Huang ............... H05K 7/20172
10,459,498 B1 * 10/2019 Kinstle, III ............... G06F 1/20
10,609,841 B2 * 3/2020 Xiao ................... H01L 23/4735
10,834,850 B2 * 11/2020 Deng ................... F28D 1/05383
2009/0040725 A1 * 2/2009 Peng ..................... H01L 23/467
361/700

(Continued)

FOREIGN PATENT DOCUMENTS

CN 109976487 A * 7/2019

OTHER PUBLICATIONS

Geng Xiantao, "Integrated Water-Cooling Radiator", Dongguan Lingsheng Pump Industry Tech Co. Ltd, Jul. 5, 2019, Entire Document (Translation of CN109976487). (Year: 2019).*

*Primary Examiner* — Stephen S Sul
(74) *Attorney, Agent, or Firm* — Karin L. Williams; Mayer & Williams PC

(57) ABSTRACT

A radiator of a display card includes a heat absorbing set, a main cooling set, and a pump assembly. The heat absorbing set has a heat absorbing base disposed on the display card and a heat exchanging tank disposed on the heat absorbing base. The main cooling set mainly includes two opposite containers disposed at two ends of a frame unit and filled with a cooling material, heat dissipating pipes communicating with the containers and inserting into the heat exchanging tank, and radiating fins disposed between the heat dissipating pipes to contribute to heat dissipation. The cooling material circulates between the containers and passes the heat exchanging tank via the heat dissipating pipes to dissipate heat and reduce the temperature of the display card effectively. The radiator is assembled with a compact structure whereby a small volume is provided to facilitate the development of computer miniaturization.

9 Claims, 12 Drawing Sheets

(56) References Cited

U.S. PATENT DOCUMENTS

| | | | |
|---|---|---|---|
| 2013/0299139 A1* | 11/2013 | Mounioloux | G06F 1/20 |
| | | | 165/120 |
| 2015/0070837 A1* | 3/2015 | Hsu | G06F 1/20 |
| | | | 361/679.47 |
| 2016/0234968 A1* | 8/2016 | Huang | G06F 1/20 |
| 2017/0108901 A1* | 4/2017 | Huang | H05K 7/20136 |
| 2017/0115708 A1* | 4/2017 | Tivadar | G06F 1/20 |
| 2018/0295746 A1* | 10/2018 | Han | H05K 7/20409 |
| 2019/0249939 A1* | 8/2019 | Otsuki | H01L 23/473 |

\* cited by examiner

RADIATOR

BACKGROUND OF THIS INVENTION

1. Field of this Invention

This invention relates to a heat dissipating device and relates particularly to a radiator adapted to dissipate heat of a display card.

2. Description of the Related Art

With the continuous development of computer technology, the performance of computers is rapidly improving. However, the energy consumption of the computer also increases, thereby causing a temperature of the computer to quickly increase. Thus, heat dissipation technology becomes very important for the computer. If the heat generated by the computer cannot be dissipated in a short period of time, the computer may run slowly or even freeze, and that will affect the performance of the computer and shorten the service life of the computer. In particular, semiconductor chips in the computer have high energy consumption, and that will generate a large amount of heat, and increase the temperature rapidly. Without proper heat dissipation, the temperature of the semiconductor chips may exceed the maximum allowable value, to further damage the semiconductor chips.

A heat dissipating fan is generally used to dissipate heat generated by the semiconductor chips. Referring to FIG. 1, the heat dissipating fan 1 is installed onto a heat generation unit 21 of a chip 2. The heat generation unit 21 is a graphics processing unit (GPU), a display card memory, or a metal oxide semiconductor field effect transistor (MOS). The heat dissipating fan 1 includes a wind guiding cover 11 and a fan unit 12 disposed on the wind guiding cover 11. When the heat generation unit 21 is running to result in the increased temperature, the fan unit 12 is then actuated to carry out the motion of air and the wind guiding cover 11 helps guide the air to thereby allow the fan unit 12 to exhaust the hot air outwards and to reduce the temperature of the chip 2. However, the heat dissipating effect still needs to be improved. Further, the heat dissipating fan 1 usually has a large volume and is difficult to install onto microchips, and affects efforts toward computer miniaturization, and that requires improvement.

SUMMARY OF THIS INVENTION

The object of this invention is to provide a radiator of a display card attaining a preferable heat dissipating effect and that can be assembled with a compact structure, whereby a small volume is provided to facilitate the development of computer miniaturization.

The radiator of this invention includes at least one heat absorbing set, a main cooling set surrounding the heat absorbing set, and a pump assembly disposed on the main cooling set. The heat absorbing set has a heat absorbing base in contact with a heat generation unit of a display card and a heat exchanging tank disposed on the heat absorbing base. The heat exchanging tank has a body, an accommodation space enclosed by the body, and a plurality of slots formed on the body. The main cooling set has a frame unit disposed on a board of the display card, a first container disposed at one end of the frame unit, a second container disposed at another end of the frame unit and situated opposite to the first container, a plurality of heat dissipating pipes disposed between the frame unit and spaced from each other to form a plurality of channels, and a plurality of radiating fins disposed in the channels. The heat dissipating pipes communicate with the first container and the second container and are inserted into the slots of the heat exchanging tank. The first container and the second container are filled with a cooling material. The pump assembly is disposed on the first container. When the display card is running and the heat generation unit generates high heat, the heat absorbing base absorbs the heat of the heat generation unit. The cooling material is then actuated by the pump assembly to circulate between the first container and the second container and pass the heat exchanging tank through the heat dissipating pipes to thereby remove the heat. Thus, a temperature of the display card can be reduced effectively and the preferable heat dissipating effect is achieved. Further, the radiating fins can help the heat dissipation of the cooling material by increasing a heat dissipating area. Hence, the radiator is convenient to use and assembled with a compact structure, whereby a small volume is provided to facilitate the development of computer miniaturization.

Preferably, the heat generation unit, is a graphics processing unit (GPU), a display card memory, or a metal oxide semiconductor field effect transistor (MOS).

Preferably, the heat absorbing set has a plurality of heat dissipating plates disposed on the heat absorbing base and arranged in rows. The heat dissipating plates extend into the accommodation space of the heat exchanging tank.

Preferably, each radiating fin has a plurality of fin plates arranged in rows and inclined to each other. The fin plates are disposed in each channel to partition each channel into a plurality of through holes.

Preferably, an interior of the first container has a first chamber and a second chamber which are formed independently of each other and configured to allow a circulation of the cooling material between the first container and the second container. The pump assembly is respectively communicated with the first chamber and the second chamber.

Preferably, at least one partition unit is disposed in the accommodation space of the heat exchanging tank to partition the accommodation space into at least two rooms. The rooms are formed independently of each other.

Preferably, at least one division wall is disposed in each room to partition each room into at least two division chambers and form a gap which allows the division chambers to communicate with each other through the gap.

Preferably, an auxiliary cooling set is disposed above the main cooling set. The auxiliary cooling set has a wind guiding cover disposed above the main cooling set and a fan unit disposed on the wind guiding cover.

Preferably, the heat absorbing set has a bottom base disposed under the heat absorbing base and a support, base disposed between the heat absorbing base and the heat exchanging tank.

Preferably, the cooling material is a refrigerant adapted to circulate between the first container and the second container.

DETAILED DESCRIPTION OF THE PREFERRED EMBODIMENTS

Figure 1:
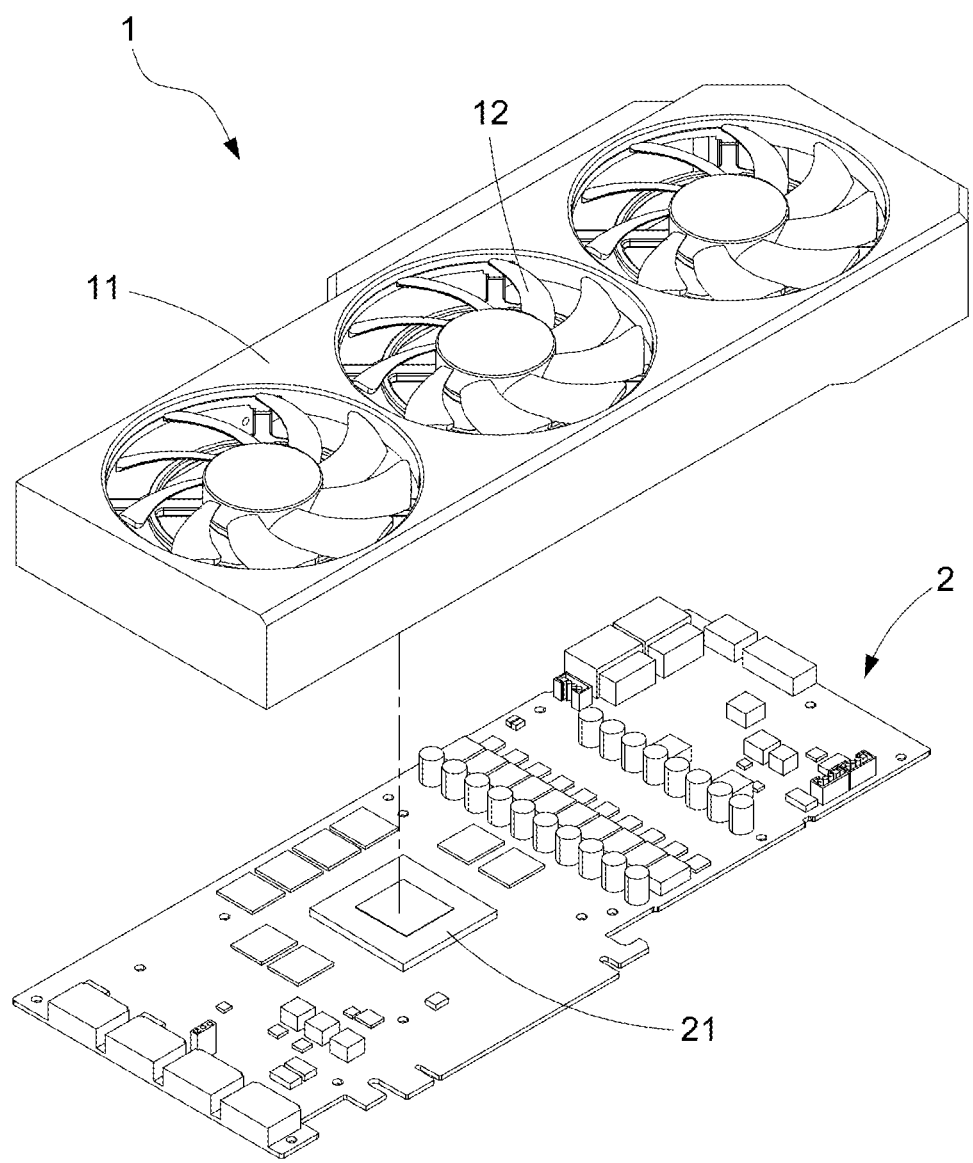
FIG. 1 is an exploded view showing a conventional heat dissipating fan.
Figure 2:
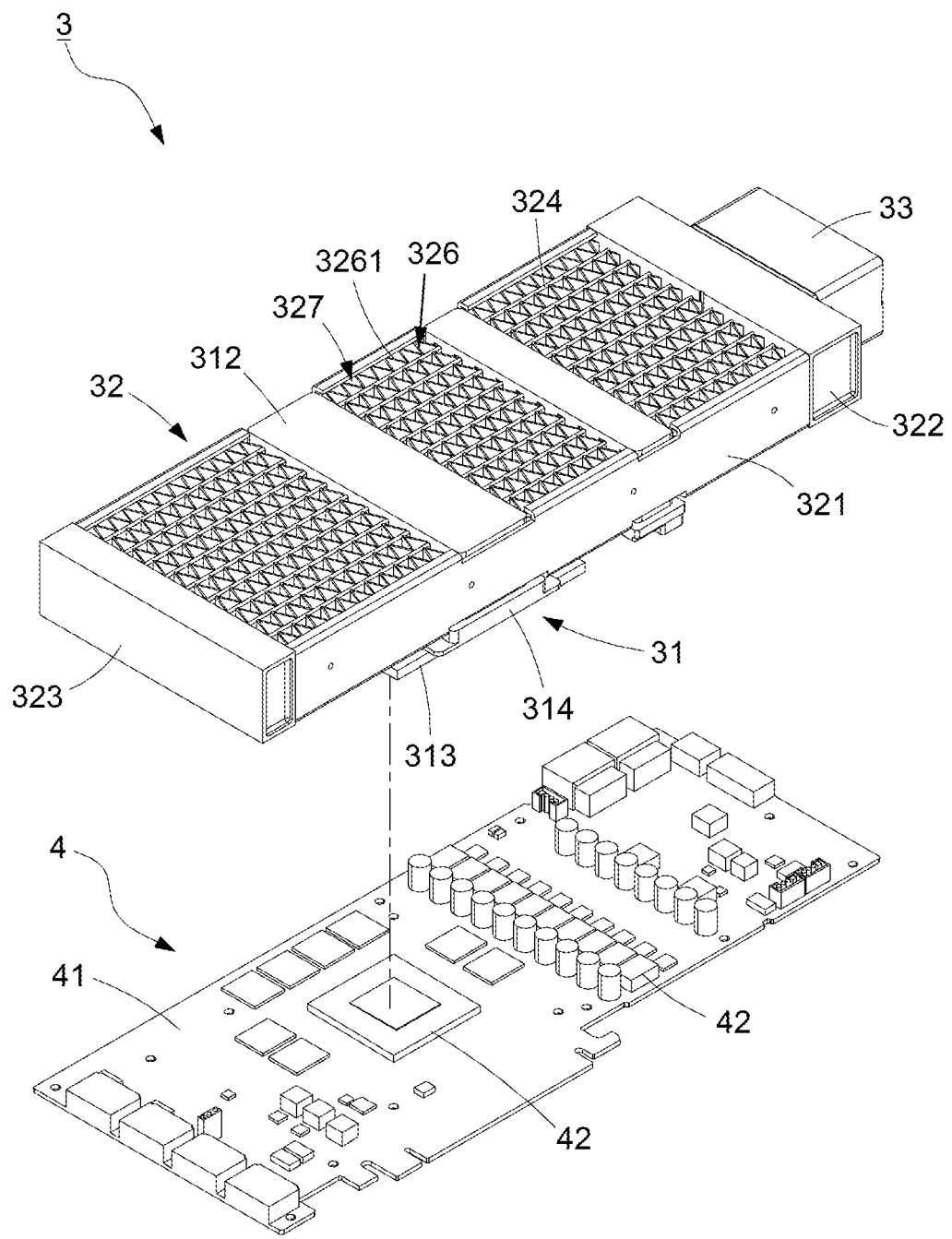
FIG. 2 is an exploded view showing a first preferred embodiment of this invention.
Figure 3:
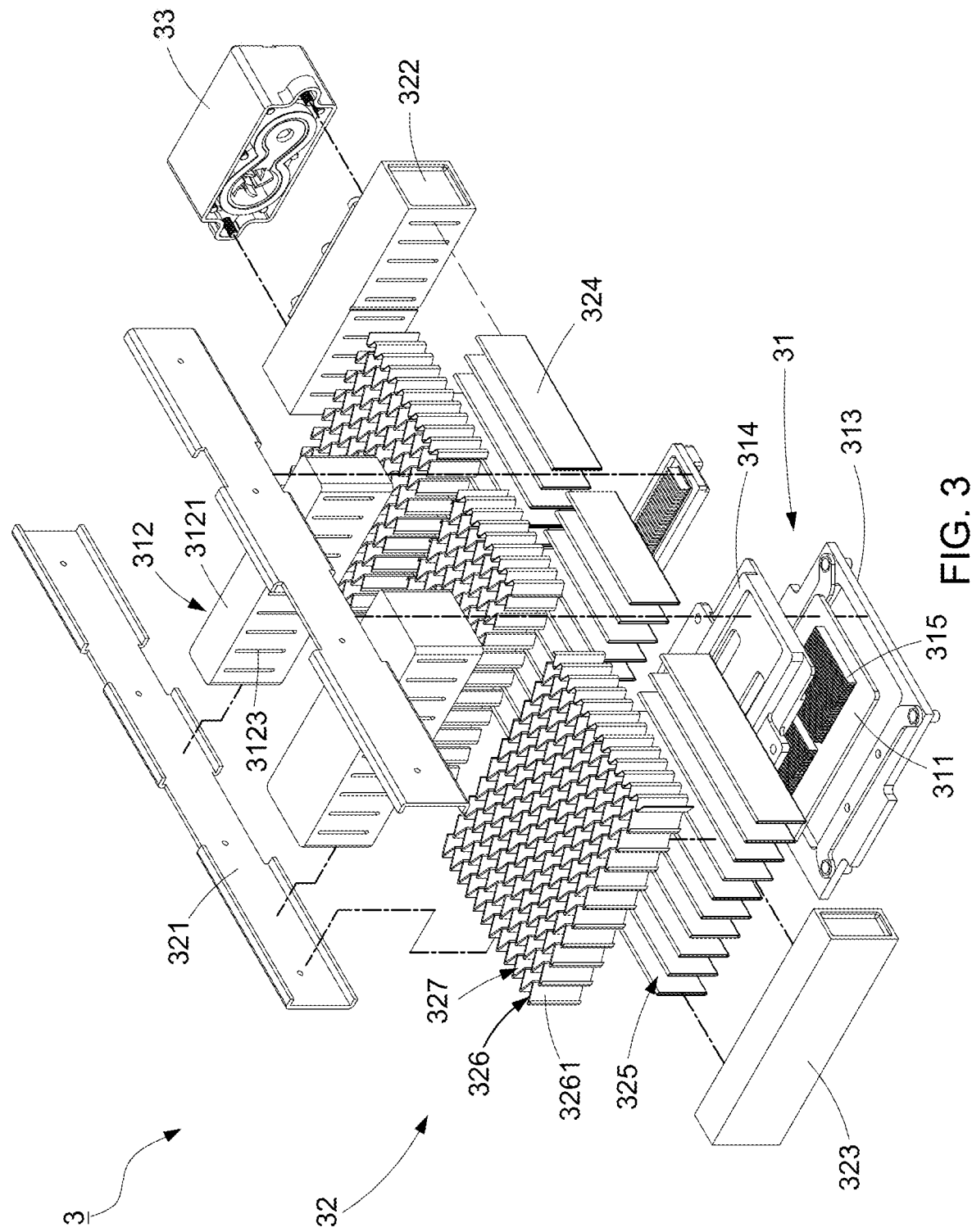
FIG. 3 is an exploded view showing the top of the first preferred embodiment of this invention.
Figure 4:
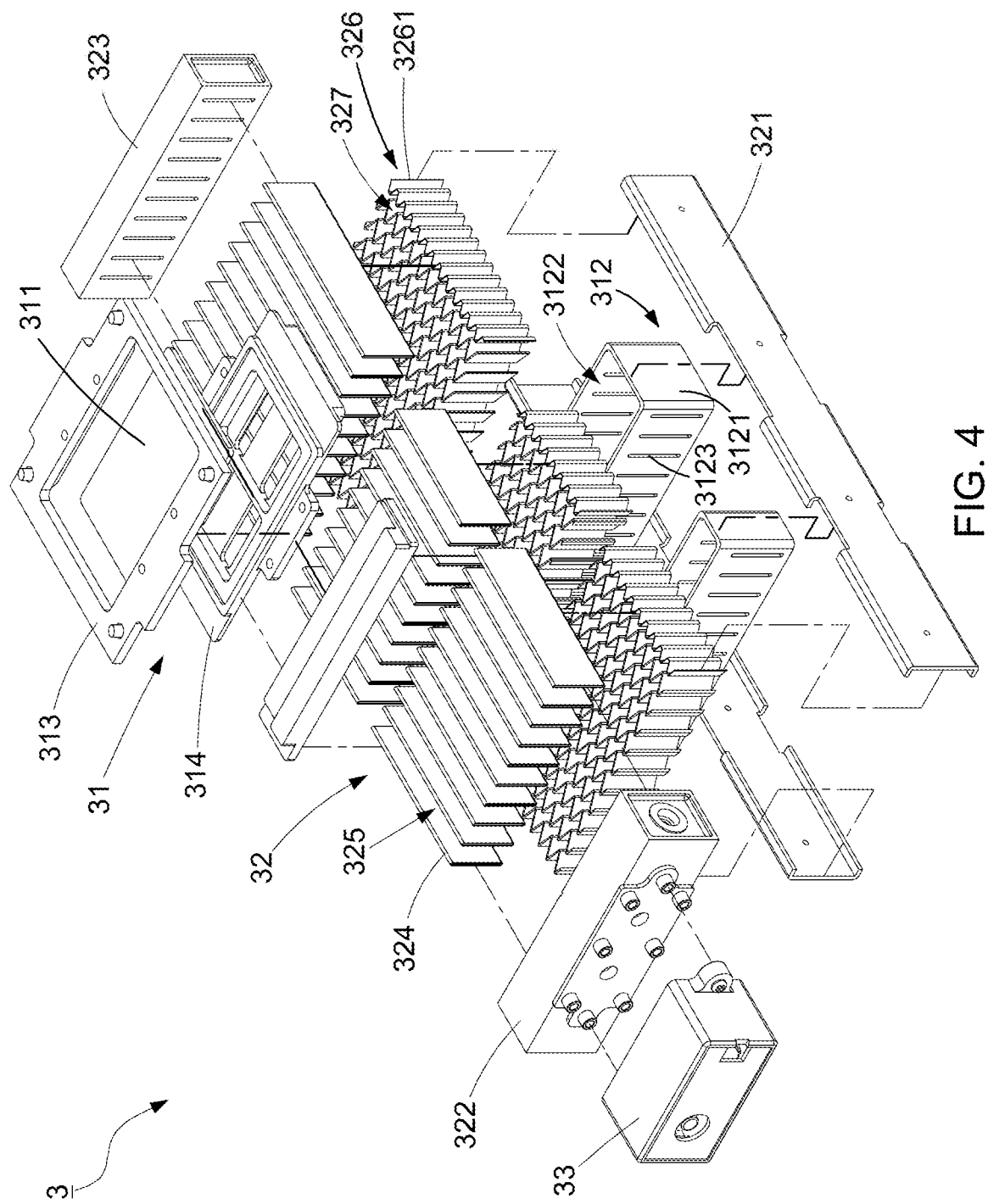
FIG. 4 is an exploded view showing the bottom of the first preferred embodiment of this invention.

Referring to FIG. 2, a radiator 3 of a first preferred embodiment of this invention is installed onto a display card 4 and adapted to dissipate heat from the display card 4. The display card 4 includes a board 41 and at least one heat generation unit 42 disposed on the board 41. The heat generation unit 42 is a graphics processing unit (GPU), a display card memory, or a metal oxide semiconductor field effect transistor (MOS). Referring to FIG. 3 and FIG. 4, the radiator 3 includes at least one heat absorbing set 31, a main cooling set 32 surrounding the heat absorbing set 31, and a pump assembly 33 disposed on the main cooling set 32. In the example, two heat absorbing set 31 are disposed on the main cooling set 32. Each heat absorbing set 31 has a heat absorbing base 311 positioned in contact with the heat generation unit 42 and a heat exchanging tank 312 disposed on the heat absorbing base 311. In this preferred embodiment, the heat absorbing set 31 further has a bottom base 313 disposed under the heat absorbing base 311, a support base 314 disposed between the heat absorbing base 311 and the heat exchanging tank 312, and a plurality of heat dissipating plates 315 disposed on the heat absorbing base 311 and arranged in rows. The heat absorbing base 311 and the heat dissipating plates 315 are preferably made of materials which can increase heat exchange efficiency and help heat conduction such as aluminum or copper to thereby facilitate heat dissipation. Meanwhile, the bottom base 313 encloses a periphery of the heat absorbing base 311 to thereby prevent the heat absorbing base 311 from being damaged caused by outer force. The heat exchanging tank 312 has a body 3121, an accommodation space 3122 enclosed by the body 3121, and a plurality of slots 3123 formed on the body 3121. The heat dissipating plates 315 extend into the accommodation space 3122 when the heat exchanging tank 312 is disposed above the heat absorbing base 311.

Figure 5:
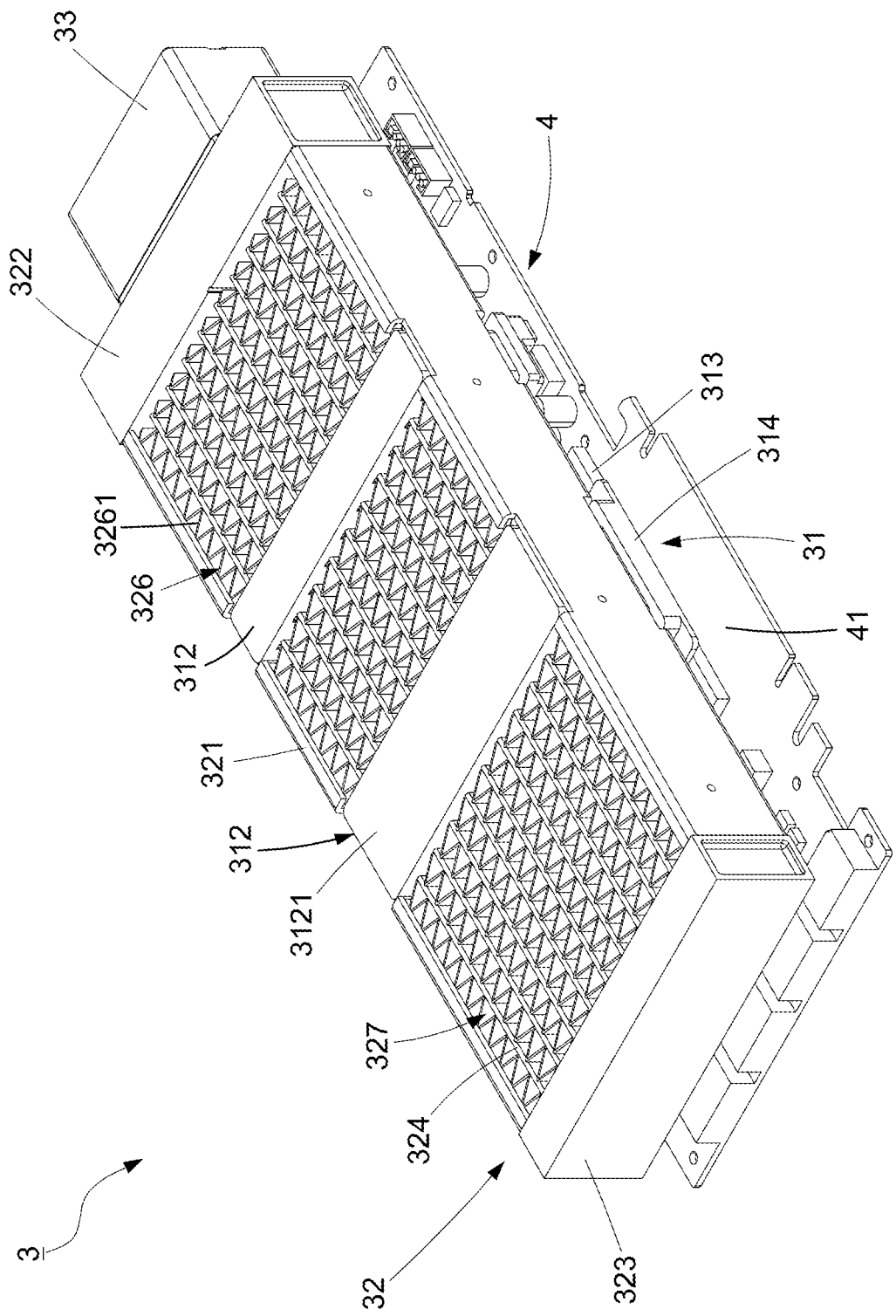
FIG. 5 is a perspective view showing the installation of the first preferred embodiment of this invention.
Figure 6:
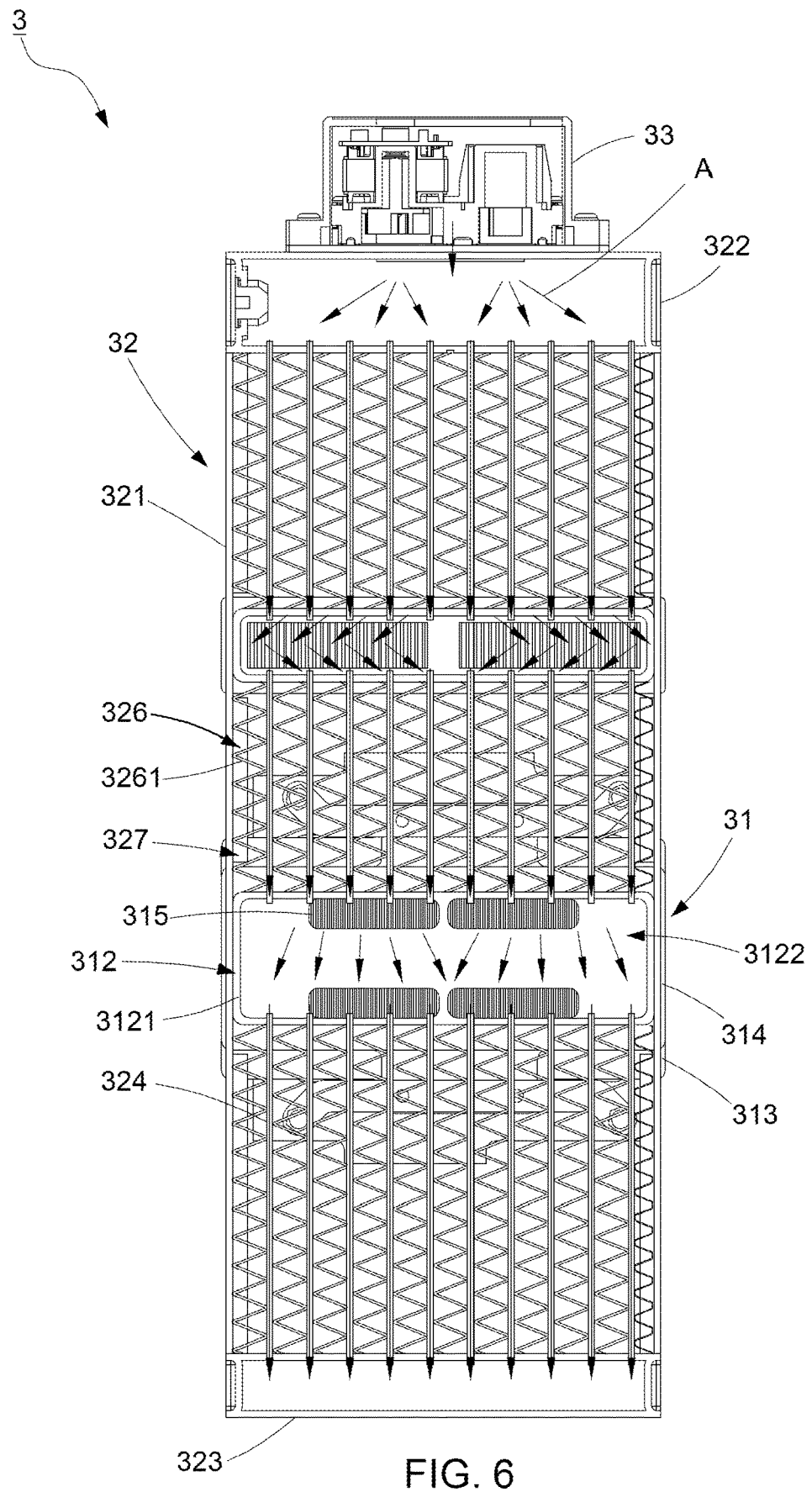
FIG. 6 is a cross-sectional view showing the flow motion of the cooling material from the first container to the second container.

Referring to FIG. 4 and FIG. 5, the main cooling set 32 has a frame unit 321 disposed on the board 41, a first container 322 disposed at one end of the frame unit 321, a second container 323 disposed at another end of the frame unit 321 and positioned opposite to the first container 322, a plurality of heat dissipating pipes 324 disposed between the frame unit 321 and spaced from each other to form a plurality of channels 325, and a plurality of radiating fins 326 disposed in the channels 325. The heat dissipating pipes 324 communicate with the first container 322 and the second container 323 and enter into the slots 3123 of the heat exchanging tank 312. Referring to FIG. 6, the first container 322 and the second container 323 are filled with a cooling material A respectively. The cooling material A is a refrigerant adapted to circulate between the first container 322 and the second container 323. In this preferred embodiment, each radiating fin 326 has a plurality of fin plates 3261 arranged in rows and inclined to each other. The fin plates 3261 are disposed in each channel 325 to partition each channel 325 into a plurality of through holes 327. The pump assembly 33 is disposed on the first container 322 and adapted to actuate the cooling material A to circulate between the first container 322 and the second container 323 through the heat dissipating pipes 324.

Referring to FIG. 2 and FIG. 5, the installation of the radiator 3 is executed by positioning the radiator 3 above the board 41 of the display card 4 to situate the heat absorbing base 311 in contact with the heat generation unit 42. Thus, the installation of the radiator 3 is simple and convenient. Moreover, a distance between the radiator 3 and the display card 4 is shortened to the minimum to thereby attain the minimum conduction distance and increase the heat conduction efficiency. Further, the radiator 3 is assembled with a compact structure whereby a small volume is provided to facilitate the development of computer miniaturization.

Figure 7:
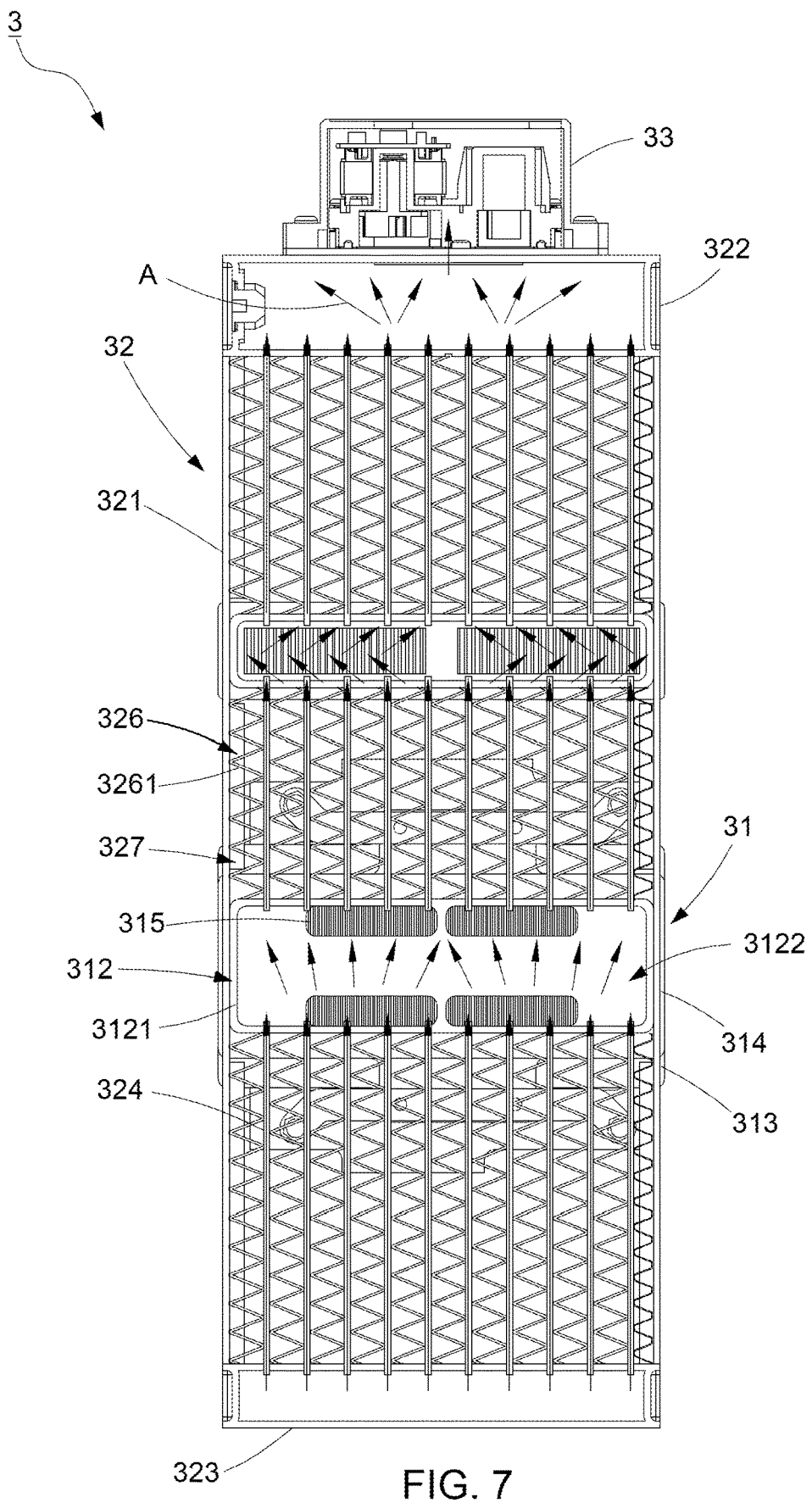
FIG. 7 is a cross-sectional view showing the flow motion of the cooling material from the second container to the first container.

Referring to FIG. 2 and FIG. 6, when the display card 4 is running, the heat generation unit 42 will generate high heat and increase a temperature of the display card 4. The heat absorbing base 311 then absorbs the heat generated by the heat generation unit 42 and conducts the heat to the heat dissipating plates 315. After that, the pump assembly 33 actuates the cooling material A filled in the first container 322 to flow toward the second container 323 and further pass the accommodation space 3122 of the heat exchanging tank 312 through the heat dissipating pipes 324. Since the heat dissipating pipes 324 insert into the accommodation space 3122 through the slots 3123, the cooling material A can absorb the heat of the heat dissipating plates 315 when passing through the accommodation space 3122 to thereby execute the heat exchange and reduce the temperature of the heat generation unit 42. Meanwhile, the spaced-apart heat dissipating plates 315 allow the cooling material A to pass therethrough to thereby increase the heat exchange efficiency and the heat dissipating effect. While the cooling material A takes the heat away and flows toward the second container 323, the radiating fins 326 facilitate the heat dissipation of the cooling material A because the radiating fins 326 can increase a heat dissipating area. Meanwhile, the through holes 327 allow air to pass therethrough to thereby enhance the heat dissipating effect. Referring to FIG. 7, the cooling material A then flows toward the first container 322 from the second container 323 and passes the accommodation space 3122 of the heat exchanging tank 312 once again to remove the heat generated by the heat generation unit 42. Therefore, the cooling material A actuated by the pump assembly 33 circulates between the first container 322 and the second container 323 to remove the heat of the heat generation unit 42 by passing through the accommodation space 3122 of the heat exchanging tank 312 via the heat dissipating pipes 324 to thereby reduce the temperature of the display card 4 effectively and attain the preferable heat dissipating effect. Furthermore, no additional piping is required for delivering the cooling material A.

Figure 8:
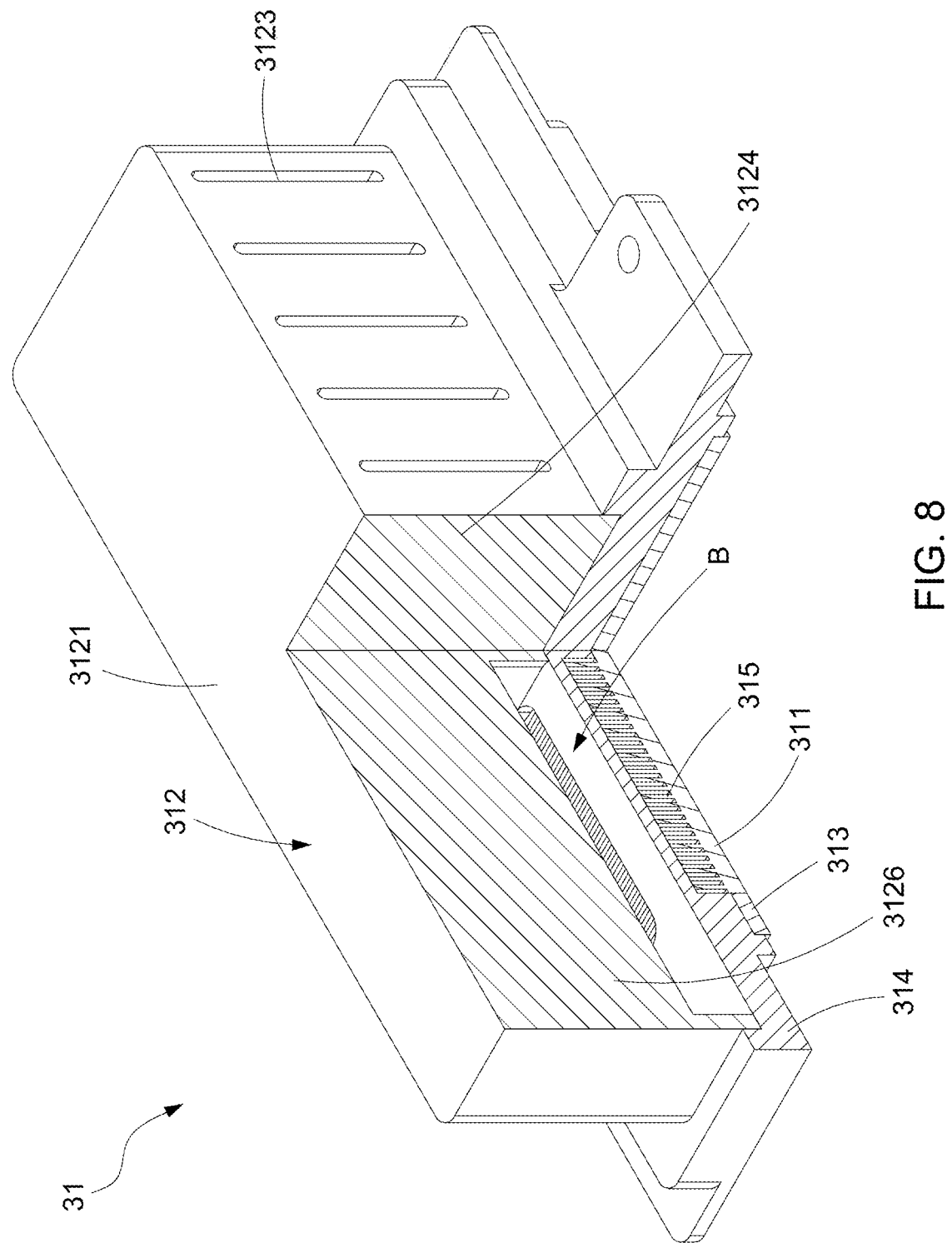
FIG. 8 is a cross-sectional view showing a second preferred embodiment of this invention characterized by the partition unit and the division wall.
Figure 9:
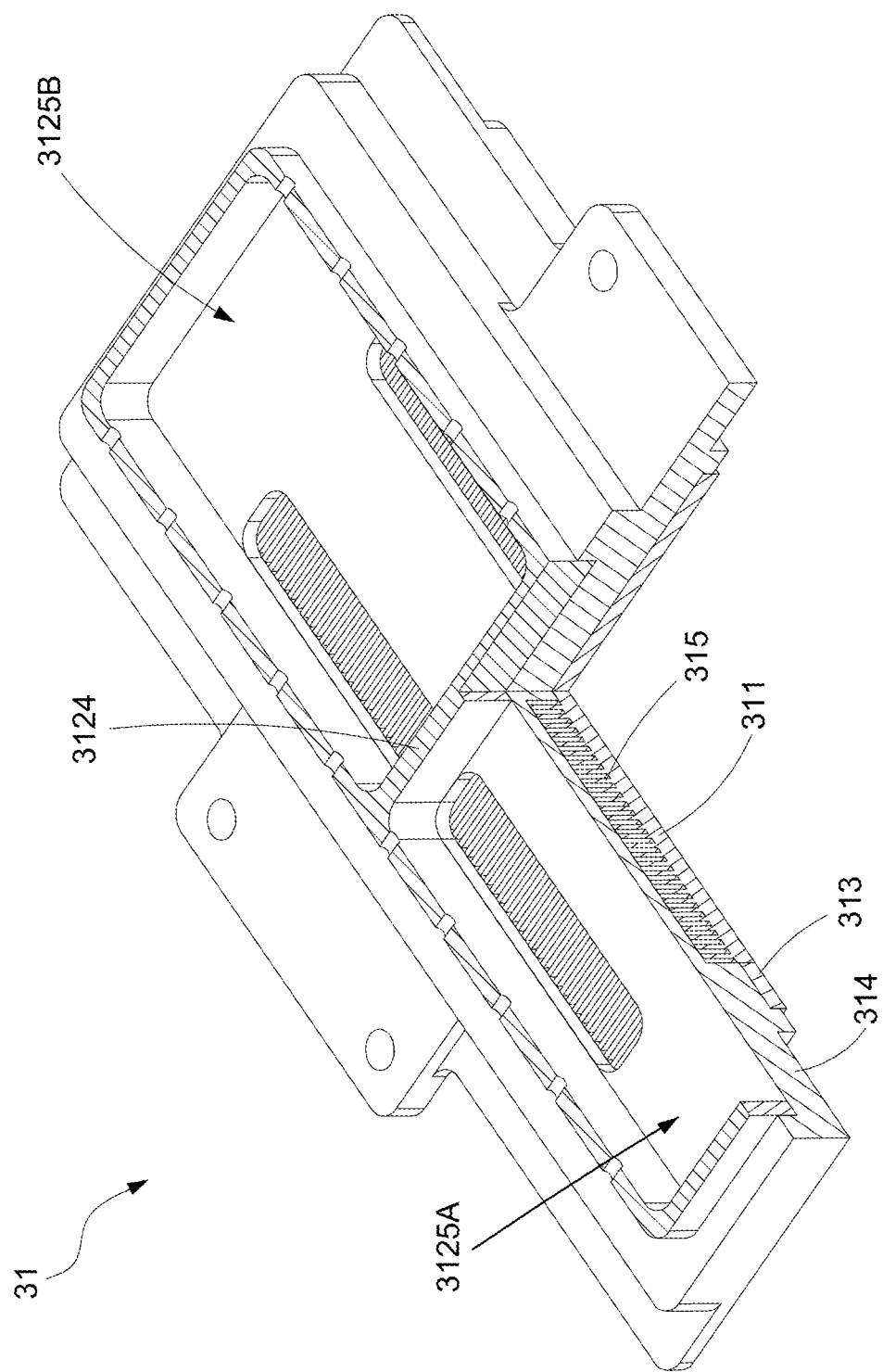
FIG. 9 is a cross-sectional view showing the heat exchanging tank.
Figure 10:
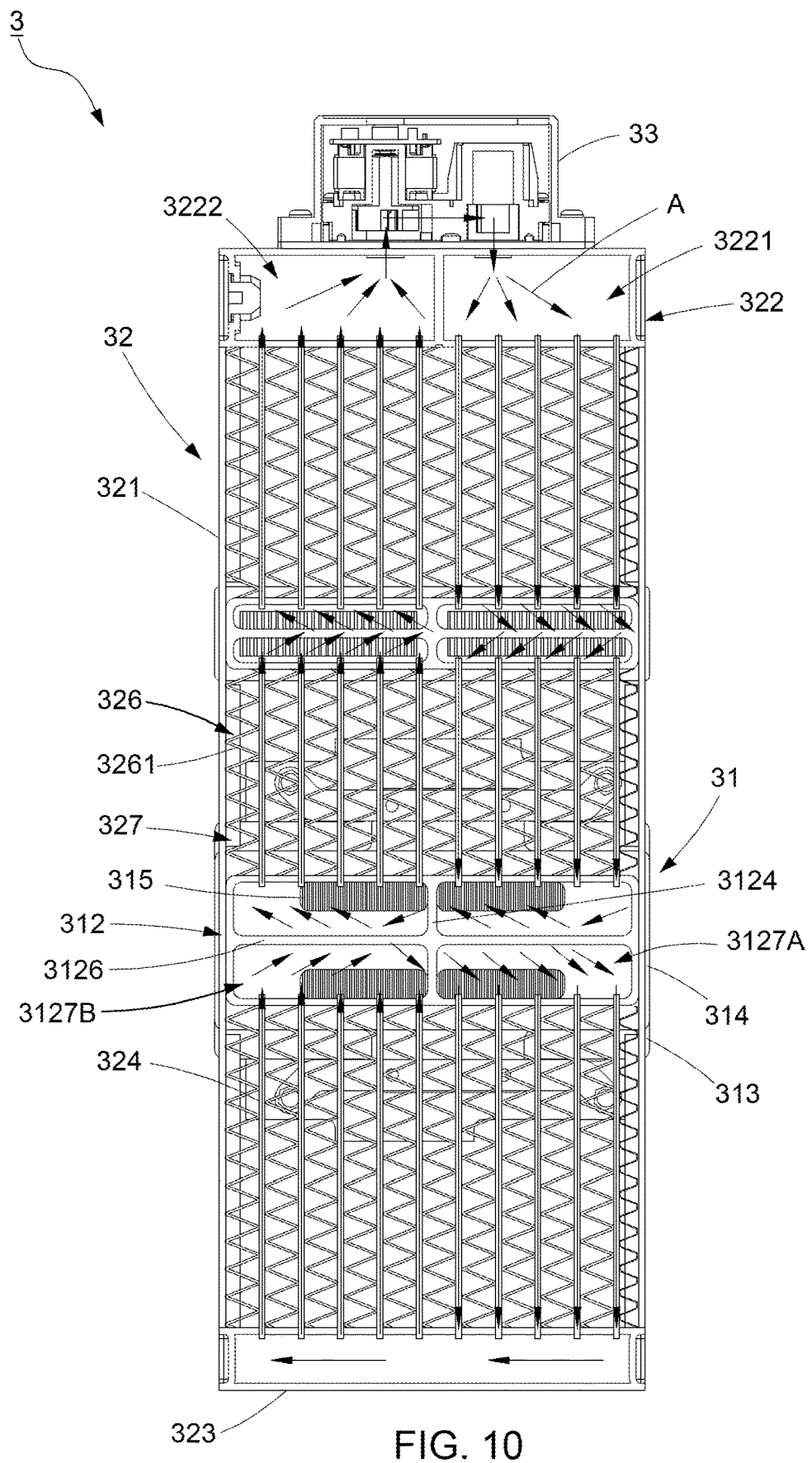
FIG. 10 is a cross-sectional view showing the flow motion of the cooling material from the first container to the second container.

FIG. 8, FIG. 9 and FIG. 10 show a second preferred embodiment of the radiator 3 of this invention. The correlated elements and the concatenation of elements, the operation and objectives of the second preferred embodiment are the same as those of the first preferred embodiment. This embodiment is characterized in that an interior of the first container 322 has a first chamber 3221 and a second chamber 3222 formed inside the first container 322 respectively. The first chamber 3221 and the second chamber 3222 are formed independently of each other and configured to allow a circulation of the cooling material A between the first container 322 and the second container 323. The pump assembly 33 is respectively communicated with the first chamber 3221 and the second chamber 3222. In this preferred embodiment, a partition unit 3124 is disposed in the accommodation space 3122 of the heat exchanging tank 312 to partition the accommodation space 3122 into a first room 3125A and a second room 3125B. The first room 3125A and the second room 3125B are formed independently of each other. A division wall 3126 is disposed in the first room 3125A to partition the first room 3125A into two first division chambers 3127A and form a gap B which allows the first division chambers 3127A to communicate with each other through the gap B. Another division wall 3126 is disposed in the second room 3125B to partition the second room 3125B into two second division chambers 3127B and form a gap B which allows the second division chambers 3127B to communicate with each other through the gap B.

Referring to FIG. 8, FIG. 9 and FIG. 10, the pump assembly 33 pumps the cooling material A from the second chamber 3222 to the first chamber 3221. The cooling material A then enters into one of the first division chambers 3127A of the first room 3125A through the heat dissipating pipes 324 and passes into another first division chamber 3127A through the gap B to thereby remove the heat absorbed by the heat absorbing base 311. The cooling material A further enters into the second container 323 and flows back from the second container 323 to one of the second division chambers 3127B of the second room 3125B and passes into another second division chamber 3127B through the gap B to execute the heat exchange once again and achieve the complete circulation. Since the first chamber 3221 and the second chamber 3222 are separated from each other, it prevents the pump assembly 33 from pumping the cooling material A which has not finished the complete circulation. Meanwhile, the separated arrangement of the first room 3125A and the second room 3125B allows the cooling material A to complete the entire circulation and further increase the heat dissipating effect. Further, each division wall 3126 can help increase the time that the cooling material A stays in the first division chambers 3127A and the second division chambers 3127B to thereby reduce the temperature of the display card 4 effectively.

Figure 11:
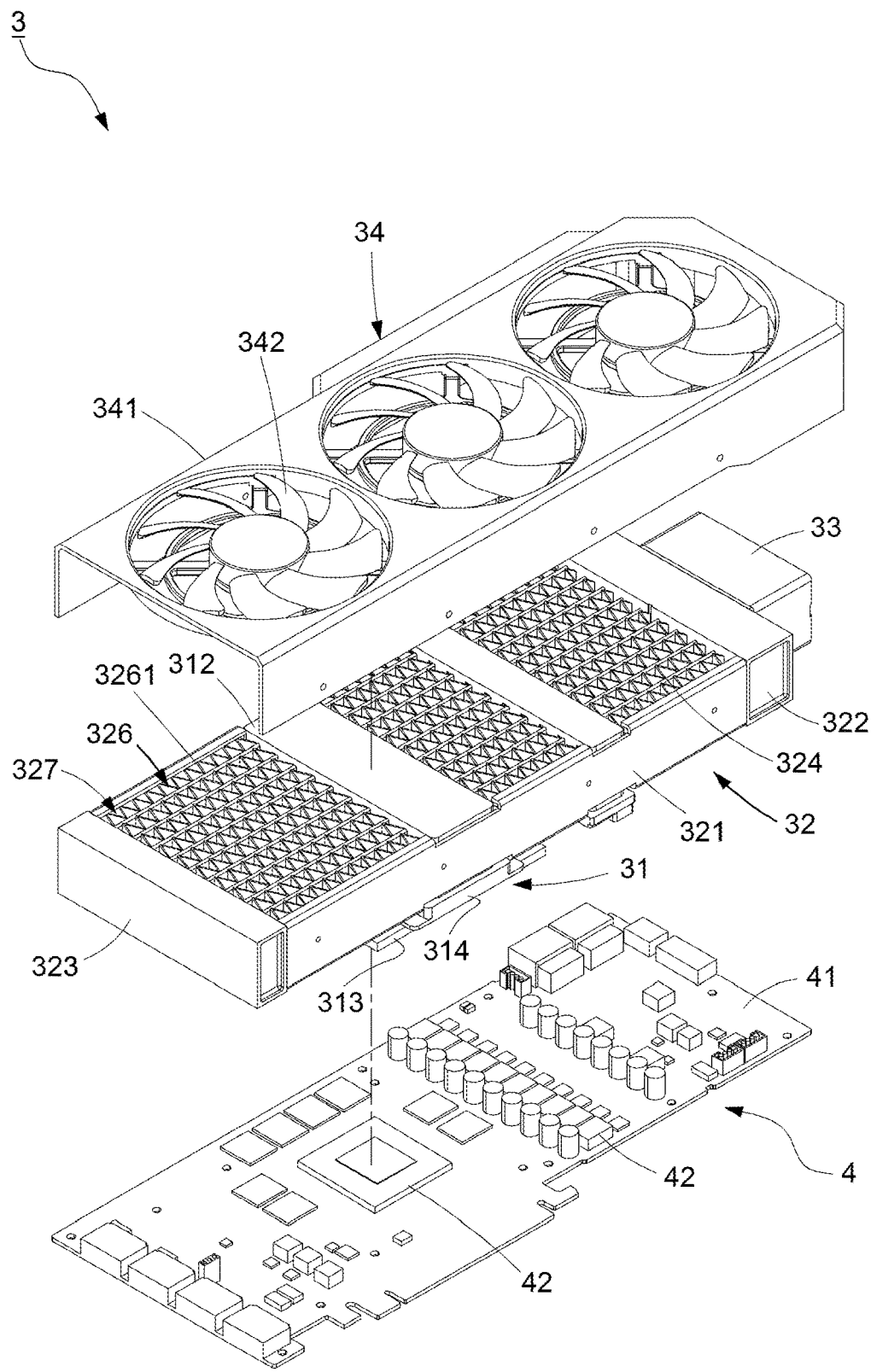
FIG. 11 is an exploded view showing a third preferred embodiment of this invention characterized by the auxiliary cooling set.
Figure 12:
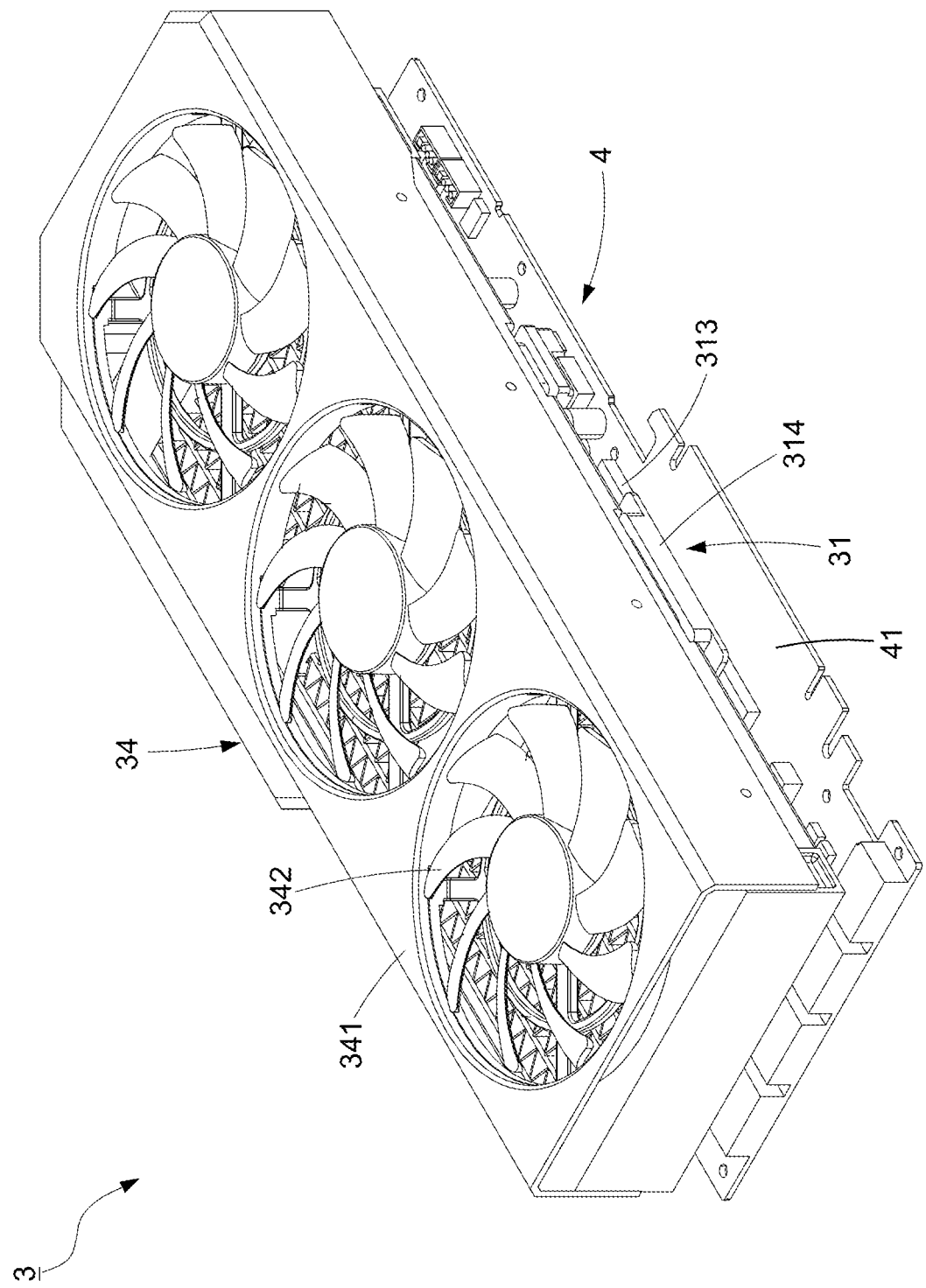
FIG. 12 is a perspective view showing the installation of the third preferred embodiment of this invention.

FIG. 11 and FIG. 12 show a third preferred embodiment of the radiator 3 of this invention. The correlated elements and the concatenation of elements, the operation and objectives of the third preferred embodiment are the same as those of the first preferred embodiment. This embodiment is characterized in that an auxiliary cooling set 34 is disposed above the main cooling set 32. The auxiliary cooling set 34 has a wind guiding cover 341 disposed above the main cooling set 32 and a fan unit 342 disposed on the wind guiding cover 341. Thus, the fan unit 342 can carry out the motion of air and the air passes through the through holes 327 to thereby accelerate the heat dissipation of the cooling material A in the main cooling set 32 and further enhance the heat dissipating effect.

To sum up, the radiator of this invention has advantages in that the heat dissipating pipes insert into the heat exchanging tank, which is disposed above the heat absorbing base, to allow the cooling material to pass the heat exchanging tank through the heat dissipating pipes and dissipate the heat absorbed by the heat absorbing base to thereby reduce the temperature of the display card effectively and increase the heat dissipating effect. Meanwhile, the radiator is assembled with a compact structure whereby a small volume is provided to facilitate the development of computer miniaturization.

While the embodiments of this invention are shown and described, it is understood that further variations and modifications may be made without departing from the scope of this invention.

What is claimed is:

1. A radiator installed onto a display card and adapted to dissipate heat from said display card, said display card including a board and at least one heat generation unit disposed on said board, said radiator comprising:
    at least one heat absorbing set including a heat absorbing base in contact with said at least one heat generation unit and a heat exchanging tank disposed on said heat absorbing base, said heat exchanging tank including a body, an accommodation space enclosed by said body, and a plurality of slots formed on said body;
    a main cooling set including a frame unit disposed on said board, a first container disposed at one end of said frame unit, a second container disposed at another end of said frame unit and situated opposite to said first container, a plurality of heat dissipating pipes disposed between said frame unit and spaced from each other to form a plurality of channels, and a plurality of radiating fins disposed in said plurality of channels, said plurality of heat dissipating pipes communicating with said first container and said second container and inserted into said plurality of slots of said heat exchanging tank, said first container and said second container being filled with a cooling material, an interior of said first container including a first chamber and a second chamber which are formed independently of each other and configured to allow a circulation of said cooling material between said first container and said second container; and
    a pump assembly disposed on said first container and respectively communicated with said first chamber and said second chamber of said first container, said pump assembly being adapted to circulate said cooling material between said first container and said second container through said plurality of heat dissipating pipes.

2. The radiator according to claim 1, wherein said at least one heat generation unit is a graphics processing unit (GPU), a display card memory, or a metal oxide semiconductor field effect transistor (MOS).

3. The radiator according to claim 1, wherein each of said plurality of radiating fins includes a plurality of fin plates arranged in rows and inclined to each other, said plurality of fin plates being disposed in each of said plurality of channels to partition each of said plurality of channels into a plurality of through holes.

4. The radiator according to claim 1, wherein an auxiliary cooling set is disposed above said main cooling set, said auxiliary cooling set including a wind guiding cover disposed above said main cooling set and a fan unit disposed on said wind guiding cover.

5. The radiator according to claim 1, wherein said at least one heat absorbing set includes a bottom base disposed under said heat absorbing base and a support base disposed between said heat absorbing base and said heat exchanging tank.

6. The radiator according to claim 1, wherein said cooling material is a refrigerant adapted to circulate between said first container and said second container.

7. A radiator installed onto a display card and adapted to dissipate heat from said display card, said display card including a board and at least one heat generation unit disposed on said board, said radiator comprising:
   at least one heat absorbing set including a heat absorbing base in contact with said at least one heat generation unit and a heat exchanging tank disposed on said heat absorbing base, said heat exchanging tank including a body, an accommodation space enclosed by said body, and a plurality of slots formed on said body;
   a main cooling set including a frame unit disposed on said board, a first container disposed at one end of said frame unit, a second container disposed at another end of said frame unit and situated opposite to said first container, a plurality of heat dissipating pipes disposed between said frame unit and spaced from each other to form a plurality of channels, and a plurality of radiating fins disposed in said plurality of channels, said plurality of heat dissipating pipes communicating with said first container and said second container and inserted into said plurality of slots of said heat exchanging tank, said first container and said second container being filled with a cooling material; and
   a pump assembly disposed on said first container and adapted to circulate said cooling material between said first container and said second container through said plurality of heat dissipating pipes,
   wherein said at least one heat absorbing set includes a plurality of heat dissipating plates disposed on said heat absorbing base and arranged in rows, said plurality of heat dissipating plates extending into said accommodation space of said heat exchanging tank.

8. A radiator installed onto a display card and adapted to dissipate heat from said display card, said display card including a board and at least one heat generation unit disposed on said board, said radiator comprising:
   at least one heat absorbing set including a heat absorbing base in contact with said at least one heat generation unit and a heat exchanging tank disposed on said heat absorbing base, said heat exchanging tank including a body, an accommodation space enclosed by said body, and a plurality of slots formed on said body;
   a main cooling set including a frame unit disposed on said board, a first container disposed at one end of said frame unit, a second container disposed at another end of said frame unit and situated opposite to said first container, a plurality of heat dissipating pipes disposed between said frame unit and spaced from each other to form a plurality of channels, and a plurality of radiating fins disposed in said plurality of channels, said plurality of heat dissipating pipes communicating with said first container and said second container and inserted into said plurality of slots of said heat exchanging tank, said first container and said second container being filled with a cooling material; and
   a pump assembly disposed on said first container and adapted to circulate said cooling material between said first container and said second container through said plurality of heat dissipating pipes,
   wherein at least one partition unit is disposed in said accommodation space of said heat exchanging tank to partition said accommodation space into at least two rooms, said at least two rooms being formed independently of each other.

9. The radiator according to claim 8, wherein at least one division wall is disposed in each of said at least two rooms to partition each of said at least two rooms into at least two division chambers and form a gap which allows said at least two division chambers to communicate with each other through said gap.

\* \* \* \* \*